(12) United States Patent
Gee

(10) Patent No.: US 6,831,520 B2
(45) Date of Patent: Dec. 14, 2004

(54) AMPLIFIER CIRCUIT APPARATUS AND METHOD OF EMI SUPPRESSION

(75) Inventor: David Martin Gee, Manningtree (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/295,620

(22) Filed: Nov. 15, 2002

(65) Prior Publication Data

US 2003/0128073 A1 Jul. 10, 2003

(30) Foreign Application Priority Data

Nov. 19, 2001 (EP) .............................. 01309723

(51) Int. Cl.[7] .............................................. H03F 3/04
(52) U.S. Cl. ..................................... 330/306; 330/310
(58) Field of Search ............................... 330/306, 310, 330/252

(56) References Cited

U.S. PATENT DOCUMENTS

| | | | | |
|---|---|---|---|---|
| 3,919,482 A | * | 11/1975 | Hamada | 381/13 |
| 4,591,805 A | * | 5/1986 | Highton | 330/294 |
| 4,864,638 A | * | 9/1989 | Zwarts | 455/205 |
| 5,111,157 A | * | 5/1992 | Komiak | 330/286 |
| 5,802,464 A | | 9/1998 | Ashida | 455/339 |
| 5,883,540 A | | 3/1999 | Kwon | 327/379 |
| 5,883,910 A | | 3/1999 | Link | 372/38 |
| 5,896,054 A | | 4/1999 | Gonzalez | 327/268 |

FOREIGN PATENT DOCUMENTS

| | | |
|---|---|---|
| JP | 08154043 | 11/1996 |
| JP | 10145221 | 5/1998 |

OTHER PUBLICATIONS

Jepsen, J., Examiner. European Search Report, Application No. EP 01 30 9723, dated May 14, 2002.

* cited by examiner

Primary Examiner—Patricia Nguyen

(57) ABSTRACT

An amplifier circuit apparatus for driving a laser device, the apparatus comprising a multistage amplifier including an output stage, wherein at least one device for band limiting a signal is coupled to the multistage amplifier prior to the output stage.

6 Claims, 4 Drawing Sheets

AMPLIFIER CIRCUIT APPARATUS AND METHOD OF EMI SUPPRESSION

FIELD OF THE INVENTION

The present invention relates, in general, to an amplifier circuit apparatus of a type used to suppress electromagnetic interference and protect circuits during current discharge conditions. The present invention also relates to a method of suppressing electromagnetic interference and reducing current discharge conditions.

DISCUSSION OF THE BACKGROUND ART

It is well known that some circuit manufacturers must regulate electromagnetic interference (EMI) generated during the operation of electronic devices and in particular EMI generated by electronic devices within integrated circuits (ICs). EMI is a noise condition and in the field of ICs designed to handle multi-level signals (e.g. a binary signal), the primary source of EMI is associated with the edge rise and fall time of the digital signal as it switches between the binary levels. The steep edges and sharp corners of a digital signal correspond to high frequency energy for which regulatory requirements for electromagnetic compatibility (EMC) are hardest to meet. Prior art circuits smooth the edges of the digital signal once output from the IC by slowing the rise and fall time of the digital signal output using filter components, thereby limiting the spectral range of the output signal and reducing the EMI at the output stage. However, the use of the filter components does not constitute an optimum solution; the filter components may affect performance characteristics of a laser device being driven in an undesired way.

It is also sometimes necessary for circuit manufacturers to protect electronic devices that are susceptible to damage or degradation from electrostatic discharge (ESD). In particular, an interference event known as Charged Device Model (CDM) ElectroStatic Discharge (ESD) may occur when there is a very fast discharge to a load from a high charge device such as a current driver for a laser diode. CDM ESD events are often very difficult events to protect against and industry standards for CDM ESD events are as severe as a 10 amp surge current spike with respective 2 ns rise and fall edges. The passage of a charge spike through an ElectroStatic-Discharge-Sensitive (ESDS) device can result in failure or performance degradation of the ESDS device such as punch-through of a transistor. CDM ESD is particularly prevalent amongst ICs and is not precluded from occurring in a circuit board. Factors contributing to the susceptibility to CDM ESD within ICs are the combination and positioning on the IC of the devices and how the routing metallisation is arranged between them. Prior art circuits employ a series resistor and a number of reverse biased diodes located at the output stage of the IC to negate the effect of CDM ESD. In this respect, FIG. 1 is a schematic diagram of an exemplary prior art circuit for an IC 18. The exemplary prior art circuit 18 comprises a voltage supply rail 26 to provide a supply voltage of $V_{cc}$ volts. The voltage supply rail 26 is coupled to a cathode of a first diode 22, an anode of the first diode 22 being coupled to a node 23. The node 23 is coupled to a first terminal of a resistor 21, the second terminal of the resistor 21 being coupled to a bond pad 20. The bond pad 20 is electrically connected through bond wires and a chip package (not shown) to the outside world, thereby forming a route whereby the ESD event can enter the IC 18. The node 23 is also coupled to a node 29, the node 29 being coupled to an internal circuit (not shown) of the IC 18 and a cathode of a second diode 24, the second diode 24 being in series connection with the first diode 22. An anode of the second diode 24 is coupled to a ground terminal 30.

In operation, the prior art circuit 18 limits the effect of CDM ESD on the laser driver circuit through the use of the first and second reverse biased diodes 22, 24. Should a positive ESD spike above Vcc be introduced to the circuit 18 via the bond pad 20, the first diode 22 will conduct and potentially harmful ESD is discharged from the circuit 18. Similarly, conduction by the second diode 24 discharges a negative ESD spike. However, CDM ESD events are typically too fast for the first and second ESD diodes 22, 24 to respond to and what protection that remains is due to the current limiting effects of the resistor 21 alone.

SUMMARY OF THE INVENTION

According to a first aspect of the present invention, there is provided an amplifier circuit apparatus for driving a laser device, the apparatus comprising a multistage amplifier including an output stage, characterised in that means for band limiting a signal are coupled to the multistage amplifier prior to the output stage.

Preferably, the multistage amplifier further includes an input stage having an input, the means for band limiting the signal being coupled to the input of the input stage.

Preferably, the multistage amplifier includes an intermediate stage having an output, the means for band limiting the signal being coupled to the output of the intermediate stage.

Preferably, the means for band limiting the signal is a filter. More preferably, the means for band limiting the signal is an RC circuit. Very preferably, the RC circuit comprises a resistance, the resistance being series coupled.

According to a second aspect of the present invention, there is provided a use of a band limiting circuit to band limit a signal prior to an output stage of a multistage amplifier.

According to a third aspect of the present invention, there is provided a method of EMI suppression in a multistage amplifier including an output stage, the method comprising the step of: receiving a data signal for amplification by the multistage amplifier, and band limiting the data signal or an amplified version of the data signal prior to final amplification of the amplification of the data signal by the output stage.

According to a fourth aspect of the present invention, there is provided a level shifting amplifier circuit apparatus comprising a node for providing a supply voltage; an amplifier circuit capable of generating an output signal in response to an input signal, the output signal including a DC voltage bias level; characterized by DC level shift means coupled between the node and the amplifier circuit, so as to generate, when in use, a potential difference across the DC level shift means, the DC voltage bias level corresponding to a difference between the supply voltage and the potential difference.

Preferably, the DC level shift means is a resistance in combination with a current source.

According to a fifth aspect of the present invention, there is provided a use of a resistance and a current source in combination to DC level shift a supply voltage applied across an amplifier circuit.

It is thus possible to provide EMI suppression using the above apparatus and/or method employing RC filter circuits. In addition to EMI suppression, the series coupling of the resistances of the RC filter circuits provides ESD protection.

BRIEF DESCRIPTION OF THE DRAWINGS

At least one embodiment of the invention will now be described, by way of example only, with reference to the accompanying drawings, in which.

DETAILED DESCRIPTION OF THE PREFERRED EMBODIMENT

Figure 1:
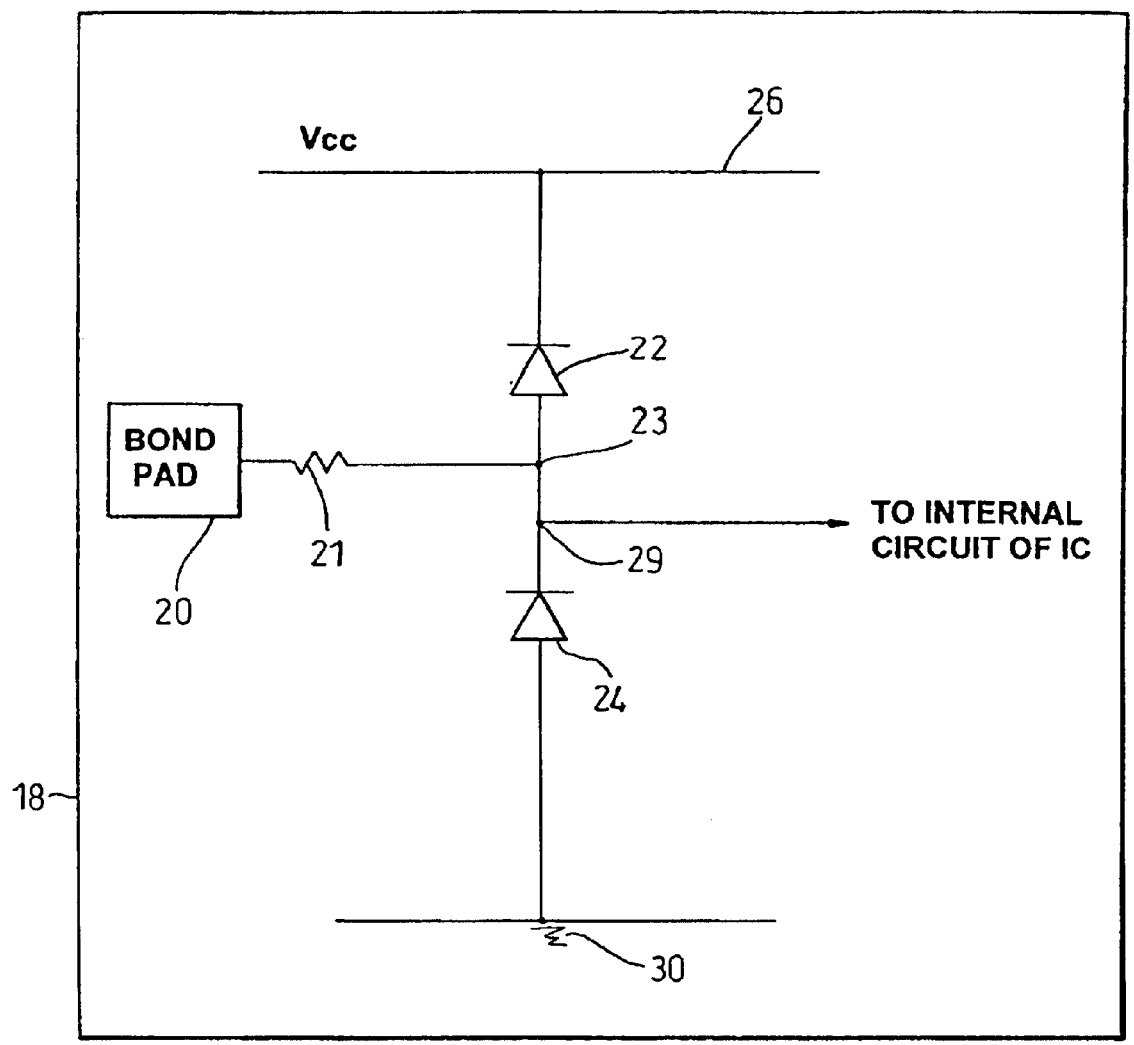
FIG. 1 is a schematic diagram of an exemplary prior art circuit for an IC.

Throughout the following description, identical reference numerals shall be used to identify like parts.

Figure 2:
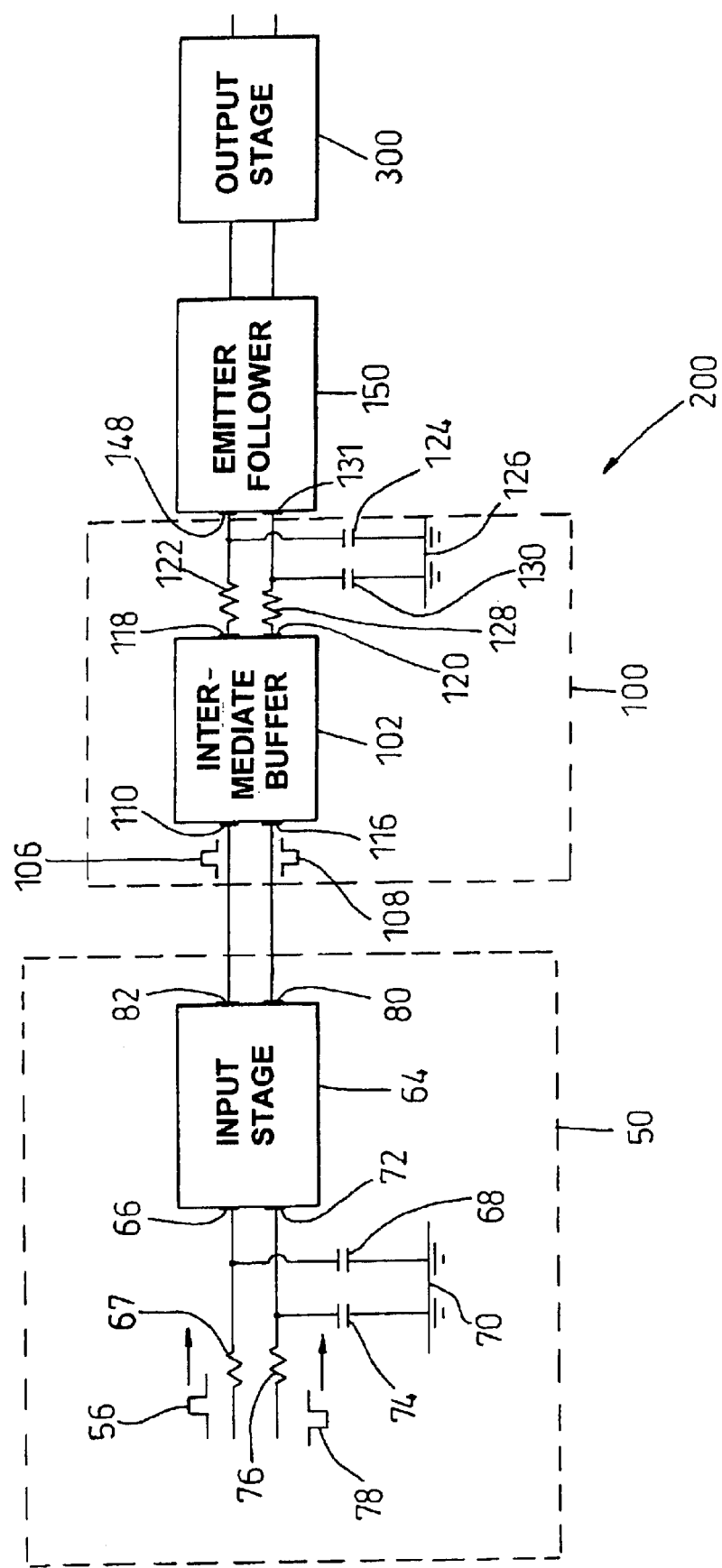
FIG. 2 is a schematic diagram including a first and a second embodiment of the invention.

Referring to FIG. 2, a multistage amplifier 200 comprises an input stage 64 coupled to an intermediate buffer 102, the intermediate buffer 102 being coupled to an output stage 300 via an emitter follower stage 150. The emitter follower stage 150 and the output stage 300 can each be fabricated according to any suitable amplifier circuit configuration known in the art. In a first embodiment of this invention, a first protected stage 50 comprises the input stage 64, a first resistor 67, a first capacitor 68, a second resistor 76 and a second capacitor 74. A first non-inverting input terminal 66 of the input stage 64 is coupled to a first terminal of the first capacitor 68, and a second terminal of the first capacitor 68 is coupled to a first AC ground node 70.

The first non-inverting input terminal 66 of the input stage 64 is also coupled to a first terminal of the first resistor 67, the first resistor 67 having a second terminal to which a first non-inverted data signal 56 is applied. The first resistor 67 and the first capacitor 68 constitute a first Resistor-Capacitor (RC) circuit.

A first inverting input terminal 72 of the input stage 64 is coupled to a first terminal of the second capacitor 74. A second terminal of the second capacitor 74 is coupled to the first AC ground node 70. The first inverting input terminal 72 is also coupled to a first terminal of the second resistor 76, the second resistor 76 having a second terminal to which a first inverted data signal 78 is applied (an inverted version of the first non-inverted data signal 56). The second resistor 76 and the second capacitor 74 constitute a second RC circuit.

The input stage 64 further comprises a first non-inverting output terminal 82 and a first inverting output terminal 80. The input stage 64 consists primarily of an amplifier circuit in a differential pair configuration of the type known to those skilled in this technical field.

In operation (of the first protected stage 50), the first non-inverted data signal 56 is applied to the first resistor 67 and to the first capacitor 68, while the first inverted data signal 78 is applied to the second resistor 76 and to the second capacitor 74. Consequently, the first input data signals 56, 78 are filtered by the first and second RC circuits, respectively, and the edges of the first input data signals 56, 78 are smoothed so that the rise and fall times of the first input data signals 56, 78 are slowed (as the signals vary, for example but not limited to switching between binary levels) thereby reducing the EMI before the first input data signals 56, 78 are applied to the input stage 64. The slowed first non-inverted data signal 56 is then applied to the first non-inverting input terminal 66 of the input stage 64 while the slowed first inverted data signal 78 is applied to the first inverting input terminal 72 of the input stage 64.

The now filtered first non-inverted data signal 56 is amplified by the input stage 64 and applied to the first non-inverting output terminal 82 of the input stage 64. Similarly, the now filtered first inverted data signal 78 is amplified by the input stage 64 and applied to the first inverting output terminal 80 of the input stage 64. Since the first and second resistors 67, 76 respectively are each in series with base terminals (not shown) of transistors of the differential pair configuration (not shown) of the input stage 64, they act to reduce surge currents being applied to the input stage 64 should an ESD event occur. Therefore, the first protected stage 50 provides good EMI and ESD protection.

In a second embodiment, a second protected stage 100 comprises the intermediate buffer, or amplifier, stage 102, a third resistor 122, a fourth resistor 128, a third capacitor 124 and a fourth capacitor 130. A second non-inverting input terminal 110 of the intermediate buffer 102 is coupled to the first non-inverting output terminal 82 of the input stage 64 to receive the amplified first non-inverted data signal 56 constituting a second non-inverted data signal 106. A second inverting input terminal 116 of the intermediate buffer 102 is coupled to the first inverting output terminal 80 of the input stage 64 to receive the amplified first inverted data signal 78 constituting a second inverted data signal 108.

A second non-inverting output terminal 118 of the intermediate buffer 102 is coupled to a first terminal of the third resistor 122, the third resistor 122 having a second terminal coupled to a first terminal of the third capacitor 124. The third capacitor 124 has a second terminal coupled to a second AC ground node 126. The third resistor 122 and the third capacitor 124 constitute a third RC circuit. The second terminal of the third resistor 122 is also coupled to a non-inverting input terminal 148 of the emitter follower stage 150. A second inverting output terminal 120 of the intermediate buffer 102 is coupled to a first terminal of the fourth resistor 128, the fourth resistor 128 having a second terminal coupled to a first terminal of the fourth capacitor 130. The fourth capacitor 130 has a second terminal coupled to the second AC ground node 126. The fourth resistor 128 and the fourth capacitor 130 constitute a fourth RC circuit. The second terminal of the fourth resistor 128 is also coupled to an inverting input terminal 131 of the emitter follower stage 150.

The first and second AC ground nodes 70, 126 described above can, alternatively, be power rails, ground power rails, a node held at a bias voltage (such as a DC bias voltage), or can be left "floating", i.e. not fixed at any particular potential.

In operation, the second non-inverted data signal 106 is applied to the second non-inverting input terminal 110 of the intermediate buffer 102 and the second inverted data signal 108 is applied to the second inverting input terminal 116 of the intermediate buffer 102. The intermediate buffer 102 amplifies the second data signals 106, 108 and applies an amplified version of the second non-inverted data signal 106 to the second non-inverting output terminal 118. Similarly, the intermediate buffer 102 applies an amplified version of the second inverted data signal 108 to the second inverting output terminal 120. The amplified second non-inverted data signal 106 is filtered by the third RC circuit and the amplified second inverted data signal 108 is filtered by the fourth RC circuit. In the same way as described in the operation of the first protected stage 50 above, the EMI is reduced by the third and fourth RC circuits, but in the second protected stage 100, the protection occurs after the input stage 64 and before the emitter follower stage 150.

Figure 3:
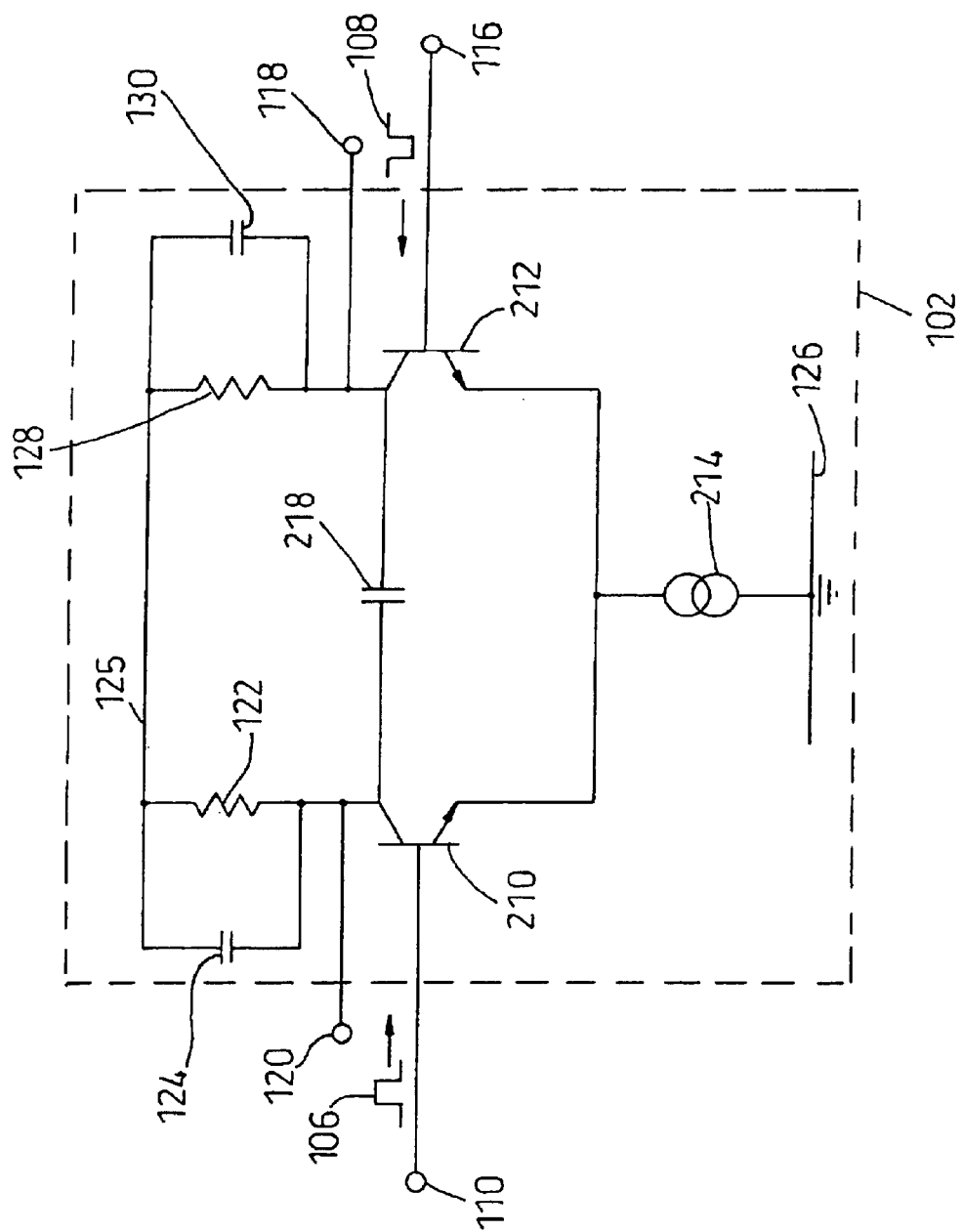
FIG. 3 is a schematic diagram of an EMI suppression circuit constituting the second embodiment of the invention.

Referring to FIG. 3, if the intermediate buffer 102 comprises an amplifier circuit having a differential pair configuration, the second protected stage 100 can be configured as follows.

The second non-inverting input terminal 110 of the intermediate buffer 102 is coupled to a base terminal of a first bipolar NPN transistor 210, the first transistor 210 having a collector terminal and an emitter terminal. The second inverting input terminal 116 of the intermediate buffer 102 is coupled to a base terminal of a second bipolar NPN transistor 212, the second transistor 212 having a collector terminal and an emitter terminal.

The emitter terminal of the first transistor 210 is coupled to the emitter terminal of the second transistor 212 and both emitter terminals are coupled to a first terminal of a first current source 214 which has a second terminal coupled to a ground voltage supply rail 126.

The collector terminal of the first transistor 210 is coupled to a first terminal of a fifth capacitor 218 which has a second terminal coupled to the collector terminal of the second transistor 212. The collector terminal of the first transistor 210 is also coupled to the second inverting output terminal 120 and further coupled to the first terminal of the third resistor 122 and the first terminal of the third capacitor 124.

The collector terminal of the second transistor 212 is coupled to the second non-inverting output terminal 118 and further coupled to the first terminal of the fourth resistor 128 and the first terminal of the fourth capacitor 130.

A second terminal of the third capacitor 124 is coupled to the second terminal of the third resistor 122 and the second terminal of the fourth capacitor 130 is coupled to the second terminal of the fourth resistor 128. The second terminal of the third resistor 122 is coupled to the second terminal of the fourth resistor 128 and a supply rail 125 at a supply voltage of $V_{cc}$ volts. Hence, the third and fourth resistors 122, 128 have a dual function of acting as a load as well as forming parts of the third and fourth RC circuits.

In operation, for differential input signals, the second non-inverted data signal 106 is applied to the base terminal of the first transistor 210 and the second inverted data signal 108 is applied to the base terminal of the second transistor 212. The third RC circuit smooths the edges of the second non-inverted data signal 106 in order to reduce the EMI emissions associated with the second non-inverted data signal 106. Concurrently, the fourth RC circuit smooths the edges of the second inverted data signal 108 in order to reduce the EMI emissions associated with the second inverted data signal 108. The provision of the third and fourth resistors 122, 128 also serves to reduce surge currents and hence ESD events.

The third and fourth capacitors 124, 130 filter both common-mode and differential input signals. To further filter the differential input signal, the fifth capacitor 218 can be employed, i.e. it is optional, in addition to, or instead of, the third and fourth capacitors 124, 130.

In a third embodiment (FIG. 4), the intermediate buffer 102 of FIG. 3 is configured as follows. Instead of being coupled to the third and fourth resistors 122, 128, respectively, the second terminals of the third and fourth capacitors 124, 130 are coupled to a first terminal of a fifth resistor 252, the first terminal of the fifth resistor 252 being coupled to the supply rail 125. A second terminal of the fifth resistor 252 is coupled to the second terminals of the third and fourth resistors 122, 128. In this example, the fifth capacitor 218 is not employed. However, as already mentioned above, the fifth capacitor 218 can, optionally, be employed. A first terminal of a second variable current source 250 is coupled to the second terminal of the fifth resistor 252 and a second terminal of the second variable current source 250 is coupled to the ground voltage supply rail 126.

Figure 4:
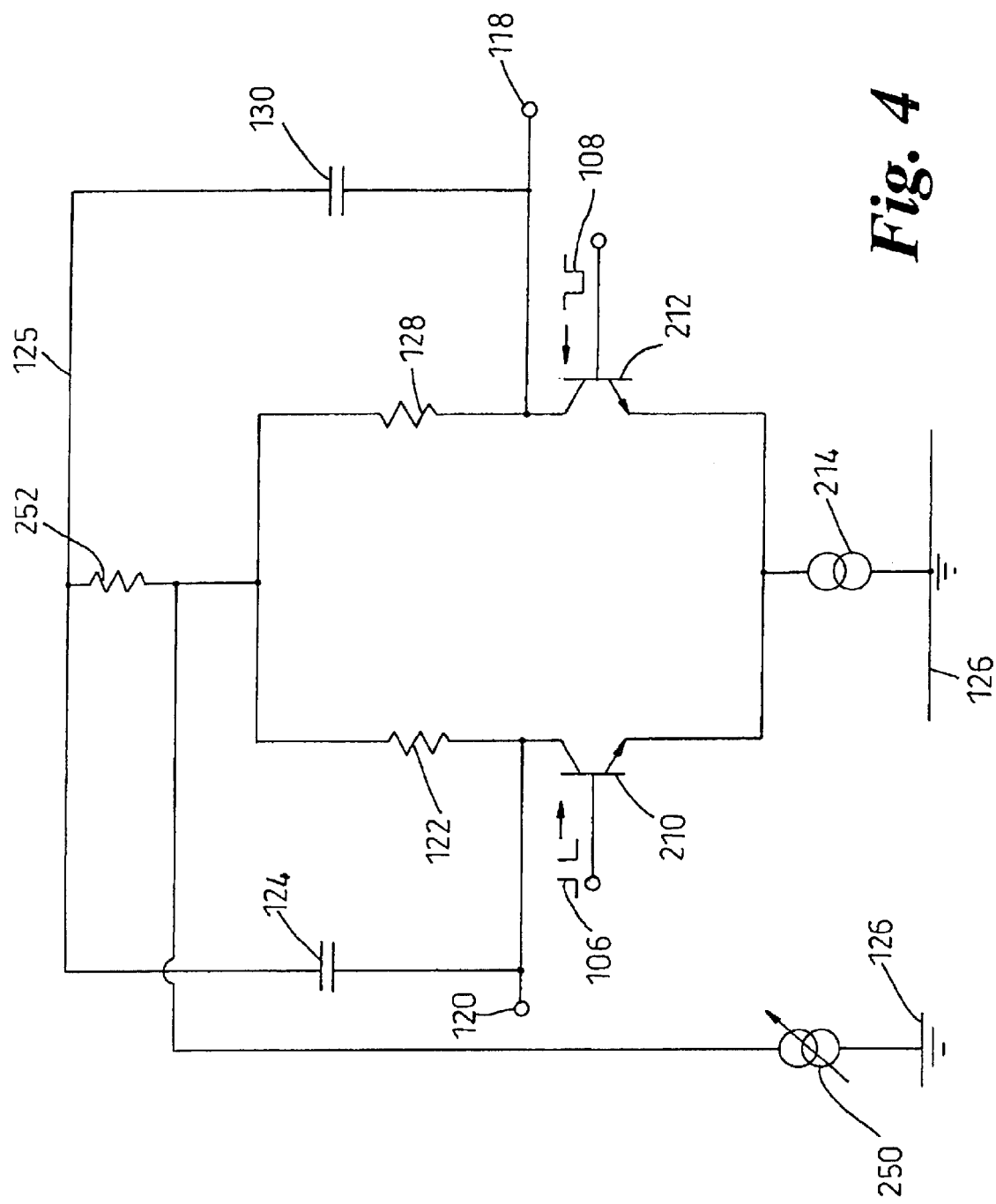
FIG. 4 is a schematic diagram of a voltage drop circuit constituting a third embodiment of the invention.

The intermediate buffer 102 of FIG. 4 amplifies in an analogous manner to the intermediate buffer 102 of FIG. 3. However, the provision of the fifth resistor 252 and the second current source 250 permits a voltage drop to occur across the fifth resistor 252, thereby providing greater voltage headroom down from the supply rail 125 so that subsequent stages coupled to the non-inverting and inverting output terminals 118, 120 can be optimally DC biased in order to make best use of available supply voltage, thereby leaving sufficient headroom to maximise the amplitude of signals driven through the subsequent amplifier stages, for example to drive a laser device (a load).

Referring back to FIG. 2, the amplified second non-inverted data signal 106 and the amplified inverted data signal 108 are applied to the non-inverting input terminal 148 and the inverting input terminal 131 for amplification by the emitter follower stage 150 and subsequent amplification by the output stage 300 prior to application to the load, for example the laser device, such as a semiconductor laser diode (not shown).

What is claimed is:

1. An amplifier circuit apparatus for driving a laser device, said apparatus comprising;
   a multistage amplifier including an output stage, and
   a device for band limiting a signal, coupled to said multistage amplifier prior to said output stage,
   wherein said device for band limiting said signal includes an RC circuit having a series-coupled resistance.

2. The apparatus of claim 1, wherein said multistage amplifier further includes an input stage having an input, and wherein said device for band limiting said signal is coupled to said input of said input stage.

3. The apparatus of claim 1, wherein said multistage amplifier includes an intermediate stage having an output, and wherein said device for band limiting said signal is coupled to said output of said intermediate stage.

4. The apparatus of claim 1, wherein said device for band limiting said signal is a filter.

5. A method of EMI suppression, comprising:
   coupling a device for band limiting a signal to a multistage amplifier prior to an output stage,
   wherein said device for band limiting said signal includes an RC circuit having a series-coupled resistance.

6. A method of EMI suppression in a multistage amplifier including an output stage, said method comprising:
   receiving a data signal for amplification by said multistage amplifier, and
   band limiting said data signal or an amplified version of said data signal prior to final amplification of said amplification of said data signal by said output stage,
   wherein said band limiting is performed by a device that includes an RC circuit having a series-coupled resistance.

* * * * *